United States Patent
Seidel et al.

(10) Patent No.: US 10,380,733 B2
(45) Date of Patent: Aug. 13, 2019

(54) METHOD AND APPARATUS FOR DETERMINING THE POSITION OF STRUCTURE ELEMENTS OF A PHOTOLITHOGRAPHIC MASK

(71) Applicant: Carl Zeiss SMT GmbH, Oberkochen (DE)

(72) Inventors: Dirk Seidel, Jena-Leutra (DE); Steffen Steinert, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 67 days.

(21) Appl. No.: 15/205,336

(22) Filed: Jul. 8, 2016

(65) Prior Publication Data

US 2017/0018064 A1 Jan. 19, 2017

(30) Foreign Application Priority Data

Jul. 13, 2015 (DE) .................. 10 2015 213 045

(51) Int. Cl.
*G06K 9/00* (2006.01)
*G06T 7/00* (2017.01)
*G06T 7/73* (2017.01)

(52) U.S. Cl.
CPC .............. *G06T 7/001* (2013.01); *G06T 7/74* (2017.01); *G06T 2207/10056* (2013.01); *G06T 2207/30148* (2013.01)

(58) Field of Classification Search
CPC . G06T 7/001; G06T 7/74; G06T 2207/10056; G06T 2207/30148
See application file for complete search history.

(56) References Cited

U.S. PATENT DOCUMENTS

| 8,694,929 | B2 | 4/2014 | Seidel et al. | |
|---|---|---|---|---|
| 2002/0102477 | A1* | 8/2002 | Tanaka | G03F 1/38 430/5 |
| 2003/0126566 | A1* | 7/2003 | Saito | G06K 9/03 716/136 |
| 2005/0031974 | A1* | 2/2005 | Fukuhara | G01N 21/95607 430/30 |

(Continued)

FOREIGN PATENT DOCUMENTS

DE 10 2010 047 051 A1 3/2013

OTHER PUBLICATIONS

"NanoImprint Lithography", Wikipedia.org, Author Unknown, Retrieved Online Jun. 8, 2018.*

(Continued)

*Primary Examiner* — Aaron W Carter
(74) *Attorney, Agent, or Firm* — Fish & Richardson P.C.

(57) ABSTRACT

The invention relates to a method and an apparatus for determining a position of at least one structure element of a photolithographic mask, wherein the method comprises the following steps: (a) providing a reference image of the at least one structure element; (b) deriving a data record for the reference image, said data record comprising metadata relating to the reference image; (c) providing at least one measured image of the at least one structure element of the photolithographic mask; and (d) optimizing the reference image by use of the derived data record and correlating the at least one measured image and the optimized reference image.

24 Claims, 12 Drawing Sheets

(56) References Cited

U.S. PATENT DOCUMENTS

| | | | |
|---|---|---|---|
| 2007/0053582 A1* | 3/2007 | Yamashita | G01N 21/95607 382/151 |
| 2010/0014083 A1* | 1/2010 | Ueno | G01N 21/9501 356/364 |
| 2011/0016437 A1* | 1/2011 | Scherubl | G03F 1/84 716/52 |
| 2011/0199501 A1* | 8/2011 | Hayashi | H04N 5/2355 348/222.1 |
| 2012/0063666 A1 | 3/2012 | Arnz et al. | |
| 2012/0070089 A1* | 3/2012 | Yamada | G06K 9/6255 382/209 |
| 2012/0081712 A1 | 4/2012 | Laengle | |
| 2012/0121205 A1 | 5/2012 | Arnz et al. | |
| 2013/0019212 A1* | 1/2013 | Seidel | G03F 1/42 716/52 |
| 2014/0270469 A1* | 9/2014 | Rotem | G06T 7/001 382/145 |
| 2014/0314305 A1* | 10/2014 | Yoshikawa | G06T 7/001 382/149 |
| 2014/0362256 A1* | 12/2014 | Schulze | H04N 5/23277 348/231.99 |
| 2015/0169997 A1* | 6/2015 | Weber | H01J 37/26 382/145 |
| 2015/0346608 A1* | 12/2015 | Seidel | G01B 11/02 355/52 |
| 2016/0241800 A1* | 8/2016 | Shin | G02B 23/2484 |
| 2017/0018064 A1* | 1/2017 | Seidel | G06T 7/001 |
| 2017/0091921 A1* | 3/2017 | Seidel | G06T 7/0004 |
| 2017/0115557 A1* | 4/2017 | Peters | G03F 1/84 |
| 2017/0269347 A1* | 9/2017 | Jackel | G01B 11/2441 |

OTHER PUBLICATIONS

Guo, L. Jay; "Nanoimprint Lithography: Methods and Material Requirements", pp. 495-513; 2007.*

German Office Action for German Application No. 10 2015 213 045.2 dated Jun. 21, 2016 (6 pages).

* cited by examiner

METHOD AND APPARATUS FOR DETERMINING THE POSITION OF STRUCTURE ELEMENTS OF A PHOTOLITHOGRAPHIC MASK

CROSS REFERENCE TO RELATED APPLICATION

This application claims priority to German patent application 10 2015 213 045.2, filed on Jul. 13, 2015, the entire contents of which are hereby incorporated by reference.

TECHNICAL FIELD

The present invention relates to a method and an apparatus for determining the position of structure elements of a photolithographic mask.

BACKGROUND

Photolithographic masks are used in lithography systems or for producing microstructured components, such as integrated circuits or LCDs (liquid crystal displays). In a lithography process or in a microlithography process, an exposure apparatus illuminates a photolithographic mask, a photomask or simply a mask. The light passing through the mask or the light reflected by the mask is projected, by using a projection microscope, onto a substrate (e.g. a wafer) which is coated with a light-sensitive layer (photoresist) and arranged in the image plane of the projection microscope in order to transfer the structure elements of the mask onto the light-sensitive coating of the substrate.

The positioning of pattern elements or structure elements on the surface of masks must be highly precise, i.e. deviations from the predetermined positions thereof or deviations from a critical dimension (CD) of a pattern element must lie in the nanometer range so as not to lead to errors on wafers during the exposure with the corresponding mask. The production of photomasks which can meet these requirements is very complex, susceptible to errors and hence expensive. Therefore, masks must be repaired wherever possible.

An important precondition for repairing defective masks is the finding and characterization of defects which are present, in particular of positioning defects or positioning errors ("registration errors" or simply "registration"). The detection of positioning defects and/or of the CD is complicated and difficult as these dimensions need to be established with an accuracy in the single-digit nanometer range, preferably in the sub-nanometer range.

Use is made of mask inspection microscopes or position determination apparatuses in order to examine positioning errors and/or the CD value. Two different groups of methods can be used for measuring structures, structure elements or pattern elements on a mask:

(a) Evaluation methods, which measure an image of the structure elements or of the pattern elements in absolute terms in respect of a reference point. Threshold-based methods are examples from this group. US 2012/0063666 A1 describes various embodiments of such analyses in detail. This group also includes centroid-based methods. A third example of this group are symmetry-correlation methods. The laid-open application DE 10 2010 047 051 A1 explains this type of evaluation on the basis of various exemplary embodiments.

(b) Evaluation methods which measure the image of structure elements relatively, i.e. which relate it to a reference image. This category includes methods which compare a measured image of structure elements with a reference image which was generated from design data of the pattern elements, i.e. which carry out a so-called "die-to-database evaluation". In this case, a reference image is also referred to as a model reference image since it was generated from the model data of the design. The U.S. Pat. No. 8,694,929 B2 describes a method in which a reference image generated from design data is not simply compared to a measured image of a mask portion, but instead the mask parameters of the reference image and the optical parameters of the recording instrument, by means of which the measured image or the measurement image was recorded, are varied at the same time by simulation in order to determine the position difference between reference image and measurement image with high precision. US 2012/0121205 A1 describes a method which renders it possible to determine the position of a second structure element relative to a first structure element or a reference element ("die-to-die evaluation").

The evaluation methods mentioned in (a) are advantageous in that they supply an absolute position specification for the structure or pattern elements of a mask lying in an image field. Here, an image field shows a part or a portion of a mask. However, these methods are disadvantageous in that they also measure artefacts of an optical position determination apparatus (e.g. aberrations, apodization, optical proximity effects, and image field distortions) and hence supply a measurement result which is falsified by the properties of the position determination apparatus.

The methods mentioned in (b) have the advantage that they are largely independent of the optical aberrations of the position determination apparatus in the case of a suitable application. If a model reference image is used, i.e. if die-to-database evaluation is carried out, this is dependent on the quality of the model function. A further advantage of the methods based on a reference image lies in the higher tolerance thereof in relation to pattern elements which have a poor signal-to-noise ratio (SNR). This renders the methods specified in (b) advantageous, for example for small structure elements in the vicinity of the resolution limit of the position determination apparatus. In contrast to the image evaluation methods listed in (a), the entire image content or all pixels are used for the comparison of the measured image and reference image in the methods based on a reference image.

On the other hand, what is disadvantageous in the case of the methods based on a reference image is that the result of the position determination of pattern elements is only known relative to the reference image. This is particularly relevant in the case of methods which are based on a measured reference image ("die-to-die") since the reference image in this case may itself have an unknown position and/or positioning error. Furthermore, the position of a measurement table which carries the mask during the recording may be afflicted by errors. Moreover, the settings of the position determination apparatus may not be ideal when recording a reference image.

The present invention is therefore based on the object of specifying a method and an apparatus for determining a position of a structure element of a photolithographic mask, which avoid the aforementioned disadvantages of the prior art at least in part.

SUMMARY

In accordance with a first aspect of the present invention, a method for determining a position of at least one structure element of a photolithographic mask has the following steps: (a) providing a reference image of the at least one structure element; (b) deriving a data record for the reference image, said data record comprising metadata relating to the reference image; (c) providing at least one measured image of the at least one structure element; and (d) optimizing the reference image by using the derived data record and correlating the at least one measured image and the optimized reference image.

A method according to the invention improves or optimizes a reference image and therefore largely eliminates the disadvantages of "die-to-die evaluation methods" which measure in a relative manner. Pattern elements on masks can be established with a greater accuracy than previously with the aid of an optimized reference image. Moreover, the CD value of the structure elements of a measured image can be determined with the aid of the optimized reference image. The outlay for optimizing a reference image is deliberately accepted. It only arises once and therefore leads only to a small reduction in the throughput of photolithographic masks to be examined, while at the same time it improves the position determination of the structure elements of the masks to be analysed.

In one exemplary embodiment, the metadata relate to at least one of the following aspects: at least one defect of the reference image; at least one incorrect setting of a measurement table, which holds a reference mask while recording the reference image, and at least one parameter setting of an optical system of a position determination apparatus while recording the reference image.

Improving or optimizing the reference image comprises not only the correction of defects of the reference image itself, but—in one exemplary embodiment—also the at least partial correction of errors which arose when recording the reference image with the position determination apparatus. As a result, the result of the correlation of a measured image and optimized reference image can be made independently of the artefacts when recording the reference image and it therefore becomes very precise.

According to a further aspect, the at least one defect of the reference image comprises at least one of the following causes: a positioning error of the at least one structure element of the reference image, a critical dimension (CD) of the at least one structure element which lies outside of a predetermined range, and noise in the reference image. Furthermore, the at least one incorrect setting of the measurement table comprises a change in position of the measurement table in the plane of the photolithographic mask in relation to a reference point while recording the reference image and/or a change in position of the measurement table in the plane perpendicular to the photolithographic mask. Moreover, the at least one parameter setting of the optical system of the position determination apparatus comprises a position of a focus when recording the reference image and/or an exposure time when recording the reference image.

In accordance with another aspect, deriving the data record comprises determining the at least one positioning error of the at least one structure element of the reference image by use of a threshold-based image evaluation method, a centroid-based image evaluation method and/or a symmetry-correlation image evaluation method, and/or determining the critical dimension of the at least one structure element by use of the threshold-based image evaluation method, the centroid-based image evaluation method and/or the symmetry-correlation image evaluation method.

With the aid of the image evaluation methods mentioned in the introductory part in (a), it is possible to analyse the structure elements of a reference image and the defects thereof can be detected at least in part. By generating an optimized reference image, it is possible to correct defects of the reference image itself and defects which arose when recording the reference image.

According to a further aspect, deriving the data record comprises recording the reference image at least twice and averaging the at least two reference images.

The reference image has noise, for example in the form of pixel noise. It is possible to obtain a reduction in the image noise of the reference element by making a plurality of recordings of the reference image and averaging these images. Since a plurality of recordings only arise for the reference image, this point is not critical for the throughput for recording measured images or measurement images of multiple pattern elements on a mask and/or for recording a plurality of photomasks.

In accordance with another aspect, deriving the data record comprises recording at least two reference images with different exposure times and scaling the at least two reference images to the exposure time of the at least one measured image.

A reduction in the noise can also be achieved by extending the exposure time in relation to the exposure time of a measurement image. When extending the exposure time, a normalization or scaling of the reference image in respect of the measured image can be carried out.

In another aspect, deriving the data record comprises determining the position of the measurement table in the plane of the photolithographic mask while recording the reference image with the aid of at least one interferometer and/or determining the position of the measurement table perpendicular to the plane of the photolithographic mask while recording the reference image with the aid of an interferometer.

The nominal position of the measurement table and its actual position can deviate from one another when recording the reference image. By virtue of measuring the actual position of the measurement table, it is possible to establish and correct, at least to a large extent, a position error of the structure element or elements of the reference image, which is caused by this deviation.

In a further aspect, deriving the data record comprises determining the position of the focus when recording the reference image by evaluating a focus stack of the reference image and/or determining the position of the focus when recording the reference image by recording a focus stack of the reference image and evaluating the focus stack of the reference image.

An incorrect focus position when recording the reference image can be established by recording a series of reference images through the focus and evaluating a contrast of the series of reference images. If a focus stack of the reference image is already available in a memory, these reference images can be analysed to determine the focus position of the reference image.

In an even further aspect, optimizing of the reference image comprises correcting the at least one positioning error of the at least one structure element of the reference image and/or correcting the critical dimension of the at least one structure element of the reference image such that this satisfies a predetermined specification.

In accordance with an expedient aspect, the optimization of the at least one positioning error of the at least one structure element of the reference image comprises displacing the at least one structure element of the reference image by a vector which describes the positioning error of the at least one structure element of the reference image. In a further aspect, correcting the critical dimension of the at least one structure element of the reference image comprises varying the critical dimension of the at least one structure element of the reference image.

According to an even further advantageous aspect, optimizing of the reference image comprises reducing the noise in the reference image by replacing the reference image with an averaged reference image of the at least two measured reference images.

As a result, errors of the reference image, which are based on limits of a detector when recording the reference image, can be corrected at least in part in an optimized reference image.

In accordance with a further aspect, optimizing the reference image comprises correcting the position of the measurement table in the plane of the photolithographic mask while recording the reference image with respect to a reference point and/or correcting the position of the measurement table in the direction perpendicular to the plane of the photolithographic mask with respect to a reference point.

According to an even further aspect, correcting the position of the measurement table in the plane of the photolithographic mask comprises displacing the at least one structure element of the reference image by a vector which describes a displacement of the measurement table while recording the reference image in respect of a reference point. Alternatively, the measured positions can be corrected by an error vector of the reference image after the recording.

This aspect renders possible the correction of errors which arose due to a deviation of the position of the measurement table from the nominal position thereof. As a result of this, it is possible largely to avoid errors which arise when transitioning from a laboratory coordinate system, which has its reference point on the measurement table, to a mask coordinate system, which has its reference point on the mask.

According to an even further aspect, the reference image and the at least one measured image comprise at least one marking for aligning the photolithographic mask.

An expedient aspect comprises the optimization of the reference image by correcting the reference image in respect of the exposure time. Another aspect comprises the optimization of the reference image by correcting the focus of the reference image.

Even though the recording of a reference image has the same artefacts as a measured image of the pattern element or elements, the reference image can have a different setting of the optical parameters and/or a different modulation of the detector of the position determination apparatus than the recording of the measured image. By virtue of the settings of the optical parameters and/or of the detector being matched to one another when recording the two images, it is possible to generate an optimized reference image which, at the same time, is designed to the best possible extent for a correlation with a measured image.

According to an even further aspect, the method furthermore has the following step after carrying out step (d): determining a displacement vector, which describes a displacement of the at least one structure element of the optimized reference image and of the at least one structure element of the at least one measured image.

Another preferred aspect furthermore has the following step: determining an absolute positioning error of the at least one structure element of the at least one measured image from an absolute position of the at least one structure element of the optimized reference image and the determined displacement vector of the at least one structure element.

A further expedient aspect furthermore has the following step: determining whether the critical dimension of the at least one structure element of the measured image satisfies a predetermined specification.

The positioning error of the structure element or elements of the measured image can be established on the basis of the optimized reference image. Furthermore, it is possible to analyse whether the CD value or values of the structure elements of the measured image lie within a predetermined bandwidth.

In accordance with a further aspect, providing the reference image comprises recording the at least one structure element of a reference mask by use of a position determination apparatus and/or establishing the reference image from design data of the at least one structure element of the photolithographic mask.

If the reference image is recorded by the position determination apparatus, it already contains the artefacts of the optical system of the position determination apparatus. If the reference image is modeled on the basis of design data, the properties of the optical system are, at least approximately, taken into account in the model reference image.

A reference image can be recorded by a special reference mask, the structure elements of which were analysed in detail in advance. It is known of the reference mask that the structure or pattern elements thereof satisfy the critical dimension(s) and are localized at the positions predetermined by the design of the mask. However, a reference image can also be taken from a portion of a production mask, where it is known that the structure elements of this portion meet the requirements in respect of the positioning and the critical dimension(s) particularly well.

In accordance with a further aspect, the provision of the at least one measured image comprises recording of the at least one measured image of the photolithographic mask by use of a position determination apparatus.

Correlating a measured image and an optimized reference image can take place directly after recording the measured image. However, it is also possible to record a sequence of measured images or measurement images of structure elements or pattern elements at different points of a photomask and/or of a plurality of photomasks and to store the measurement images. Correlating the measurement images with an optimized reference image can then take place at a later time. It is preferable for a reference image and a measurement image of a pattern element to be recorded by the same position determination apparatus. However, this is not a precondition for applying the above-defined method.

According to an even further aspect, the image data of the reference image and of the measured image comprise a two-dimensional grid of pixels and/or the image data of the reference image and of the at least one measured image have the same number of pixels. Images whose image data satisfy these conditions are expedient for a correlation process. However, they are not absolutely necessary for carrying out the position determination method specified above.

In a further preferred aspect, an apparatus for determining a position of at least one structure element of a photolithographic mask comprises: (a) means for providing a reference image of the at least one structure element; (b) means for deriving a data record for the reference image, said data record comprising metadata relating to the reference image; (c) means for providing at least one measured image of the at least one structure element of the photolithographic mask; and (d) means for optimizing the reference image and means for correlating the at least one measured image and the optimized reference image.

In accordance with a further expedient aspect, the apparatus is embodied to carry out the method steps of the aspects described above.

According to an even further preferred aspect, a computer program contains instructions which prompt a computer system to execute the method steps according to one of the above-described aspects.

Finally, according to another further advantageous aspect, a position determination apparatus for determining a position of at least one structure element of a photolithographic mask comprises: (a) a measurement table which is movable in at least two spatial directions and which is embodied to hold the photolithographic mask; (b) an optical system comprising an exposure system and a detector which is embodied to record the reference image of the at least one structure element and to record at least one measured image of the at least one structure element; (c) an analysis unit which is embodied to analyse the reference image for deriving at least one data record which relates to the reference image; (d) an optimization unit which is embodied to optimize the reference image with the aid of the derived data record; and (e) a correlation unit which is embodied to carry out a correlation of the optimized reference image and the at least one measured image.

DESCRIPTION OF DRAWINGS

The following detailed description describes currently preferred exemplary embodiments of the invention, with reference being made to the drawings:

-FIG. 11*a*, depicts the associated reference image in sub -FIG. 11*c*, depicts a portion of a second mask in sub-FIG. 11*b* and specifies the corresponding reference image in sub-FIG. 11*d*;

DETAILED DESCRIPTION

Below, currently preferred embodiments of a method according to the invention and of a device according to the invention are explained on the basis of the application to transmitting and reflecting masks. However, the method according to the invention for determining defects of a photolithographic mask, preferably of the absorber layer thereof, is not restricted to the examples discussed below. Rather, in general, it can be used for measuring or characterizing structures, in particular microstructures, on an object carrier.

Figure 1:
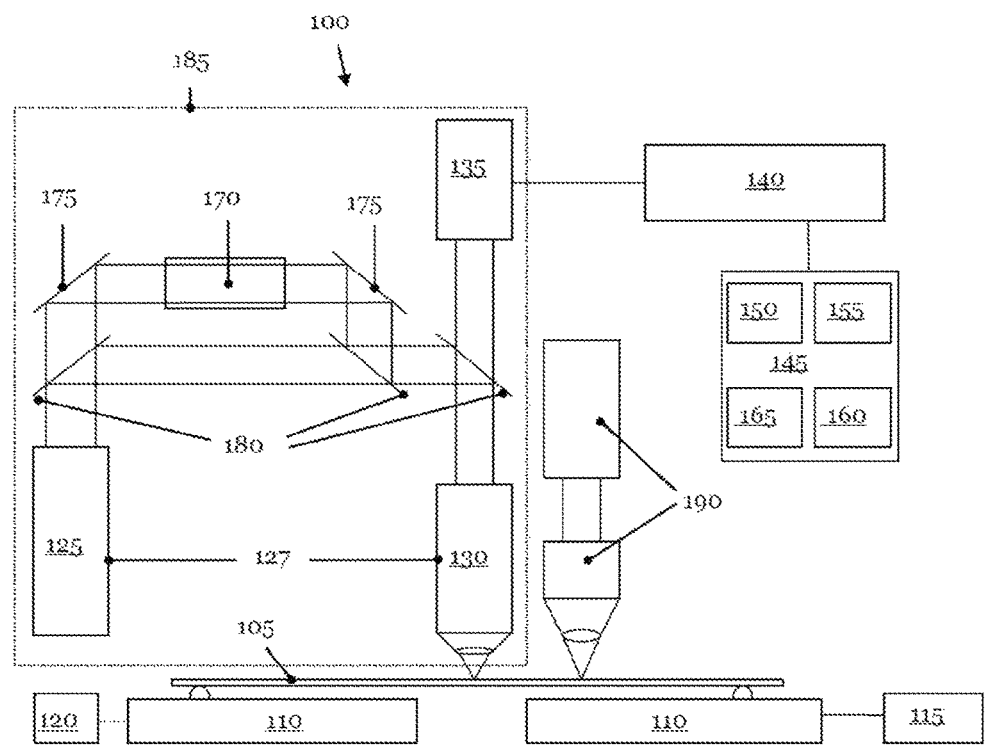
FIG. 1 schematically shows a block diagram of some important components of a position determination apparatus.

FIG. 1 shows a section through a schematic sketch of a position determination apparatus 100, by means of which it is possible to measure positioning errors of structure elements or pattern elements, the critical dimension of pattern elements, i.e. the CD (critical dimension) thereof, and/or overlay errors when aligning the masks of a mask stack. A photolithographic mask 105 is held by a very precise measurement table 110. In the example depicted in FIG. 1, the photomask 105 is a reflecting mask, for example a mask for the extreme ultraviolet (EUV) wavelength range. The measurement table 110 is actively controlled in all six degrees of freedom by a positioning device 115 and, in the example depicted in FIG. 1, it is the only movable part of the position determination apparatus 100. The position of the measurement table 110 in the plane of the photomask 105, which is referred to as xy-plane below, is detected by one or more interferometers 120, for example by one or more laser interferometers. Furthermore, an interferometer can be used to determine the position of the measurement table 110 in the z-direction (not depicted in FIG. 1).

An excimer laser generating light in the DUV (deep ultraviolet) wavelength range, for example an ArF (argon fluoride) laser which emits at a wavelength in the region of 193 nm, is used as a light source 125 in the position determination apparatus 100. In the example depicted in FIG. 1, the lens 130 has a numerical aperture (NA) of 0.6. However, it is possible to use a lens 130 with a greater NA in the position determination apparatus 100 in order to increase the resolution capability of the position determination apparatus 100. The laser radiation of the light source 125 is focused onto the surface of the mask 105 by moving the measurement table 110 in the vertical direction or z-direction. The top side of the mask 105, which is the side of the mask 105 facing the lens 130, has structure elements or pattern elements which are not depicted in FIG. 1.

A CCD (charge coupled device) sensor 135 forms a spatially resolving detector of the position determination apparatus 100. The CCD sensor 135 measures the light which is locally reflected by the mask 105. Typically, a CCD sensor 135 comprises a two-dimensional pixel arrangement or a pixel array, for example a 1000×1000 pixel configuration. The CCD sensor 135 transmits the measurement signal thereof to the signal processing unit 140, which calculates an image from the signal detected by the CCD sensor 135. The exposure system 127 with, as essential components, light source 125 and lens 130, and the detector 135 form the optical system 185 of the position determination apparatus 100.

A computer system 145 can display the image which was calculated by the signal processing unit 140 and/or it can store the measured data as raw data and/or as image data in a non-volatile memory 150. For reasons of simplicity, the display of the computer system 145 has not been depicted in FIG. 1. The computer system 145 comprises an analysis unit 155, by means of which a reference image or a series of reference images can be analysed in order to establish metadata in relation to the reference image, with the aid of which the reference image can be improved or optimized. Furthermore, the analysis unit 155 can process the image data of a reference image which was recorded by the optical system 185 of the position determination apparatus 100.

With the aid of the metadata of a data record established by the analysis unit 155, an optimization unit 160 can generate an optimized reference image which can be stored in the memory 150 of the computer system 145. A correlation unit 165 can correlate a measured image or a measurement image with the optimized reference image.

Finally, the analysis unit 155 can determine a displacement of the structure elements of the two images relative to one another on the basis of the correlated image data. Moreover, the analysis unit 155 can make a decision on the basis of the correlated image data as to whether or not the CD value of the structure element or elements of a measured image meets a predetermined specification.

For these objects, the analysis unit 155, the optimization unit 160 and/or the correlation unit 165 can contain algorithms which are realized in hardware, software or a combination of the two. As depicted in the example of FIG. 1, the analysis unit 155, the optimization unit 160 and/or the correlation unit 165 can be integrated into the computer system 145 or these units can be embodied separately from the computer system 145 as independent units (not shown in FIG. 1). Furthermore, it is possible to combine the analysis unit 155, the optimization unit 160 and/or the correlation unit 165 in an evaluation unit (not depicted in FIG. 1).

The computer system 145 can monitor and/or control the positioning unit 115 of the measurement table 110, the interferometer or interferometers 120, the light source 125, the lens 130, the CCD sensor 135, the signal processing unit 140, the analysis unit 155, the optimization unit 160 and/or the correlation unit 165.

The surface of the photolithographic mask 105 can be slightly tilted. Moreover, a slight curvature of the mask 105 due to the inherent weight thereof leads to a variation in the best focus condition. Therefore, the position determination apparatus 100 has an autofocus (AF) system 170 on the basis of an oblique grid (not depicted in FIG. 1). The tilted mirrors 175 and the partly transmissive mirrors 180 direct the laser beam onto the lens 130. Furthermore, the position determination apparatus 100 comprises an optical auxiliary system 190 for roughly aligning the lens 130 onto the pattern elements of the photomask 105.

If the mask 105 is a transparent mask the light source 125 is directed from below onto the photomask 105 by a second lens and the lens 130 collects the laser radiation departing from the surface of the photomask 105 (not shown in FIG. 1).

Figure 2:
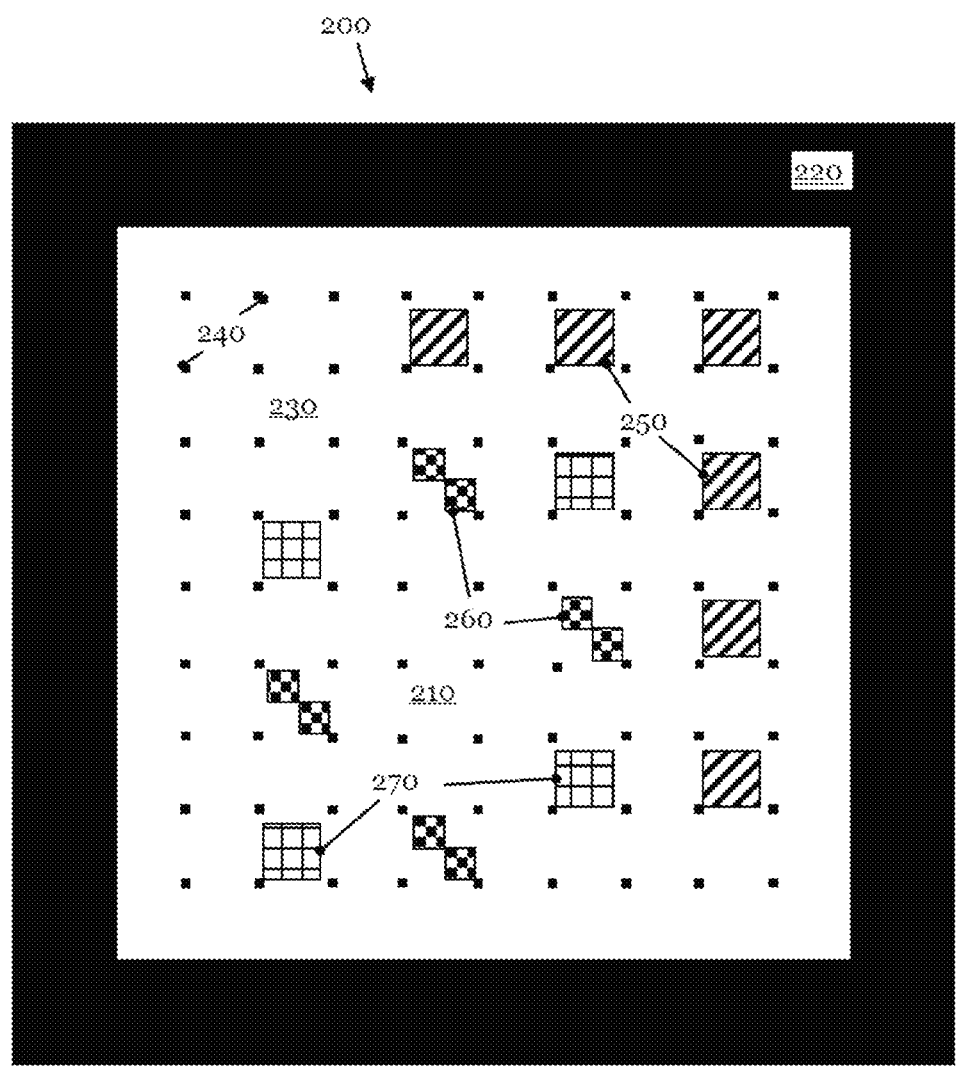
FIG. 2 depicts a schematic plan view of a photomask.

FIG. 2 shows a schematic plan view of a transmitting photomask 200. The active region 210, i.e. the region which can carry structure elements, is surrounded by the non-transparent, non-active region 220. Markings or alignment markings 240 are attached to the substrate 220 of the mask 200 at periodic intervals in the active region 210. The scanner or the stepper of an exposure system is aligned relative to the photomask 200 on the basis of the markings 240. The structure elements of the same or different chips or dies are attached between the alignment markings 240. In the example depicted in FIG. 2, these are the chips 250, 260 and 270. A reflecting mask has an EUV-radiation-reflecting multi-layer structure between the substrate 220 and the pattern elements of the chips 250, 260, 270 (not shown in FIG. 2).

Figure 3:
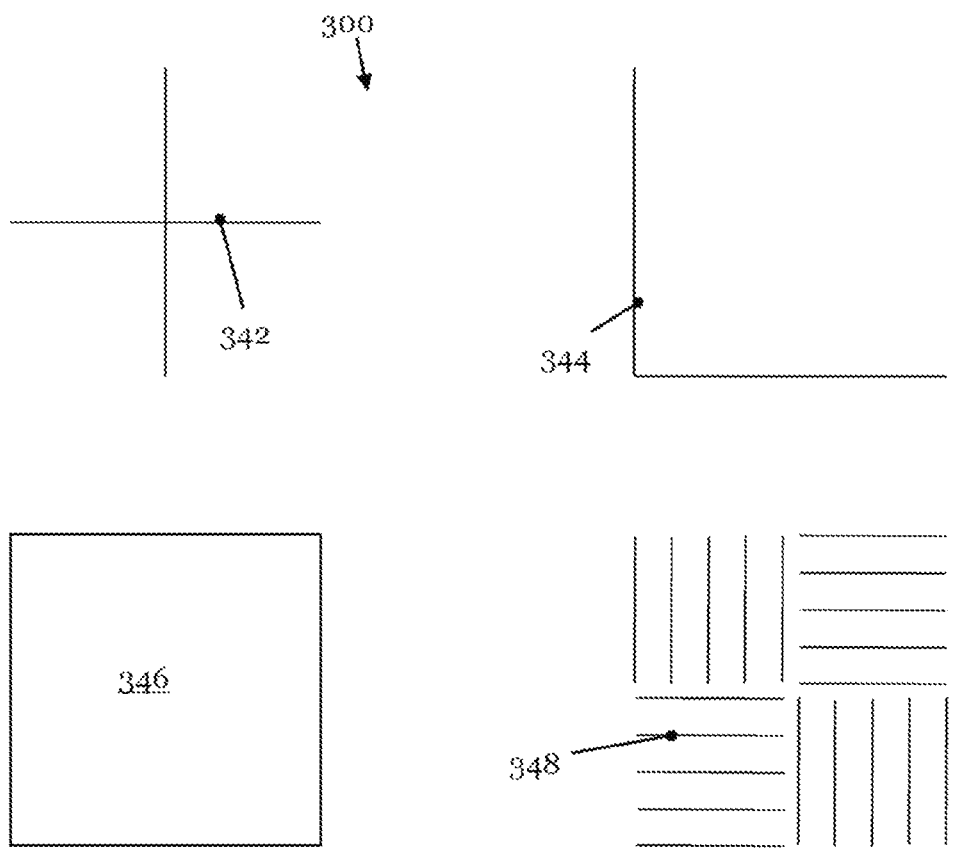
FIG. 3 represents schematic plan views of exemplary alignment markings.

Exemplary alignment markings 240 are depicted in the diagram 300 of FIG. 3. A box 346 is specified in FIG. 3 in addition to a cross 342 and an angle 344. In addition to these simpler markings, it is also possible to use more complex structures with some or many elements (AIM, Advanced Imaging Metrology). FIG. 3 provides an example under reference sign 348.

Figure 4:
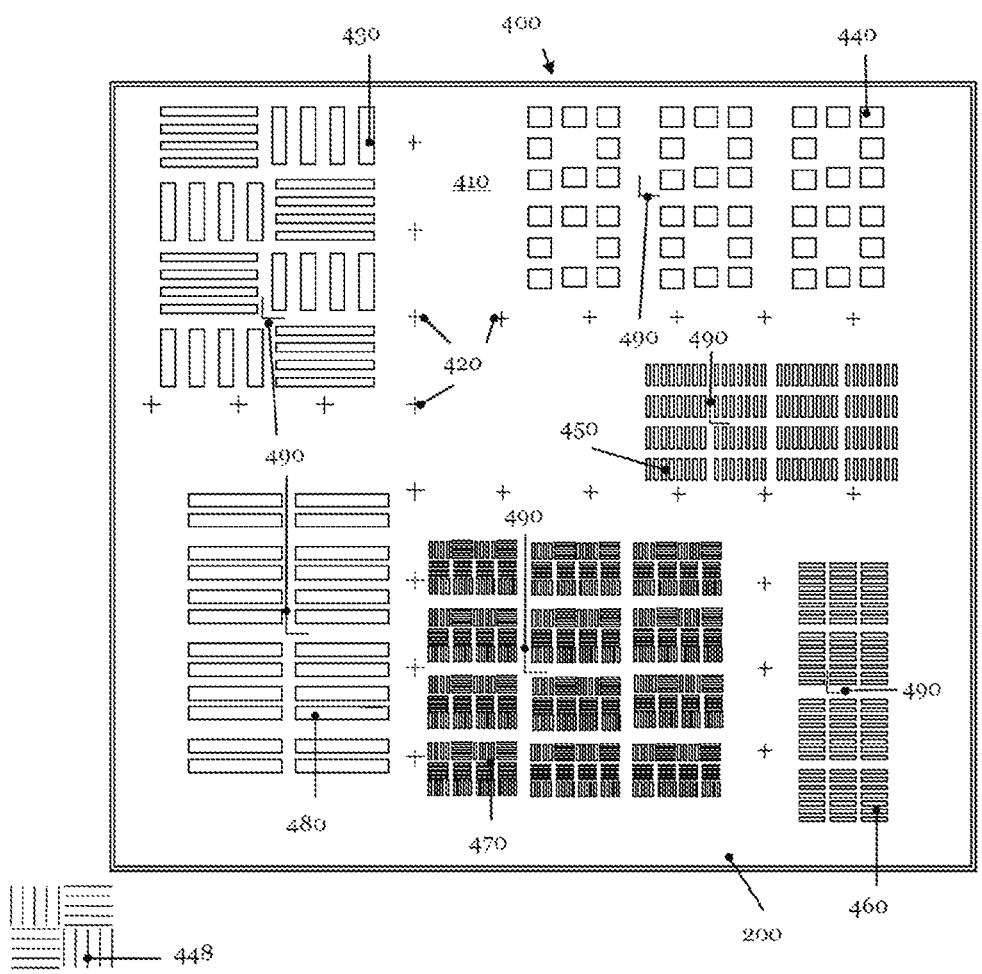
FIG. 4 depicts a schematic plan view of a chip of a photomask with a plurality of pattern elements.

The diagram 400 in FIG. 4 shows, in a magnified schematic manner, a plan view of one of the chips 250 of the photomask 200 of FIG. 2. The adjacent alignment marking 448 is visible at the lower left-hand edge of the chip 410. The chip 410 or the die contains an arrangement of various pattern elements 430, 440, 450, 460, 470 and 480 within the chip area 490. In the example of FIG. 4, the various structure elements 430, 440, 450, 460, 470 and 480 have a test structure 490 in the form of an angle for determining the critical dimension of the corresponding pattern element. Attaching the test structure 490 simplifies the establishment of the CD value of the pattern elements 430, 440, 450, 460, 470 and 480. Since the critical dimension itself can also be measured directly at one or more points of the pattern element, the application of the test structures 490 is optional. Additional markings 420 (in-die markings) are attached within the chip area 490, said markings simplifying the alignment of the mask 200 and of a scanner or stepper. These are once again optional since the alignment markings 240 can be used to align the measurement table 110 onto the mask 105, 200.

Below, the production of an optimized reference image on the basis of the exemplary pattern element 470 of the chip 410 of the mask 200 is now described. A reference image of the pattern element 470 is recorded in the first step. By way of example, this is carried out using the position determination apparatus 100 explained in FIG. 1. A reference image of the pattern element 470 can be brought about by recording a portion of the mask 200 which contains the pattern element 470. The mask 200 can be a mask used during the production. However, the reference image of the structure element 470 can also be recorded from a reference mask produced specifically for this purpose (not depicted in FIG. 4).

It is also possible that a reference image of the pattern element 470 is already available in the memory 150 of the computer system 145 and this is used to derive metadata for improving or optimizing the available reference image. Furthermore, a reference image of a structure element can be generated from design data of the mask 105, 200, i.e. a model reference image is produced. It is moreover conceivable to synthesize a reference image by combining a measured reference image and a reference image generated from design data.

Figure 5:
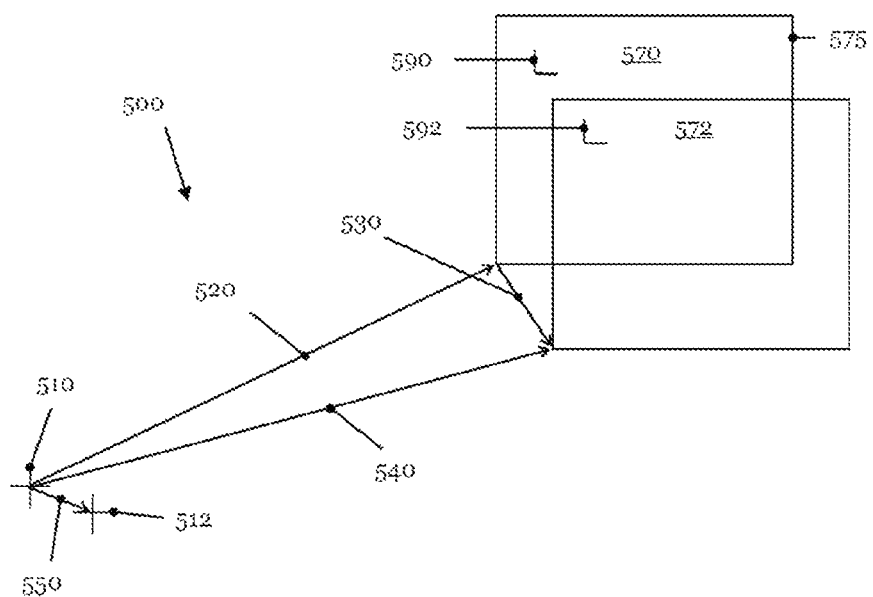
FIG. 5 schematically elucidates a reference image and some possible errors of a reference image.

The diagram 500 in FIG. 5 schematically elucidates the derivation of metadata for a reference image. For reasons of simplicity, only the outer contour 575 of the reference image 570 of the pattern element 470 is depicted in FIG. 5. Additionally, a test structure 590 for determining the critical dimension in the reference image 570 is symbolized. The cross 510 marks the coordinate origin of the measurement table 110 of the position determination apparatus 100 in the mask plane, i.e. in the xy-plane. This coordinate system is often referred to as a laboratory coordinate system. It is associated with the mask coordinate system, i.e. the coordinates of the alignment markings 240 and/or the in-die markings 420, by way of aligning the markings 240, 420 of the mask 200 with corresponding markings of the measurement table 110 (not depicted in FIGS. 1 and 5).

The two-dimensional (2D) vector $\vec{E}_{Re.Meas.}(x,y)$ 520 determines the location of the reference image 570 of the pattern element 470 in relation to the origin of the laboratory coordinate system, as measured with the aid of the optical system 185 of the position determination apparatus 100. The 2D vector $\vec{E}_{Re.Meas.}(x,y)$ represents an absolute measurement of the position of the pattern element 470.

The reference image 570 is now analysed in detail using one or more image evaluation methods which measure in absolute terms (i.e. in respect of the coordinate origin 510). To this end, use can be made of e.g. a threshold-based method, a centroid-based method and/or a symmetry-correlation method. Examining the reference image 570 in this manner yields a position of the reference image 572, which is described by the 2D vector $\vec{E}_{Re.Int.}(x,y)$ 540. The vector $\vec{E}_{Re.Int.}(x,y)$ 540 specifies the correct position or the more correct position of the reference image 570 in relation to the coordinate origin 510. The 2D vector $\Delta\vec{E}_{Re.}(x,y) = \vec{E}_{Re.Int.}(x,y) - \vec{E}_{Re.Meas.}(x,y)$ 530 describes the displacement of the pattern element 470 of the reference image 572, which was analysed by use of at least one image evaluation method measuring in absolute terms, in relation to the measured reference image 570. The vectors $\Delta\vec{E}_{Re.}(x,y)$ or $\vec{E}_{Re.Int.}(x,y)$ are metadata of a data record which is used to optimize the reference image 570 of the pattern element 470 of the mask 200.

In addition to establishing the position of the reference image 570 in respect of the coordinate origin 510, the optical system 185 of the position determination apparatus 100 can also determine the critical dimension of the test structure 590. In a manner analogous to the analysis of the positioning error or write error of the pattern element 470 of the reference image 570, the above-described image evaluation methods measuring in absolute terms can be used to analyse the CD value of the test structure 590. A CD variation of the two measurement methods can be determined in a manner similar to the above vector consideration for the displacement of the pattern element 470 of the reference image 570: $\Delta CD = CD_{Re.Tar.} - CD_{Re.Meas.}$, wherein $CD_{Re.Tar.}$ denotes the CD value of the test structure 590 of an image evaluation method measuring in absolute terms and $CD_{Re.Meas.}$ denotes the critical dimension of the test structure 590 of the reference image 570. The CD variation $\Delta CD$ or the more precise CD value $CD_{Re.Tar.}$ can, as metadata, likewise be added to the data record which is used to optimize the reference image 570 of the pattern element 470.

While the reference image 570 is recorded, the nominal position of the measurement table 110 can deviate from its actual position. This corresponds to a shift in the coordinate origin 510 of the laboratory coordinate system, which can be detected by way of e.g. an interferometer. In FIG. 5, this is elucidated by the vector $\Delta\vec{D}(x,y) = (0,0)_{Meas.} - (0,0)_{Tar.}$ 550. The actual position of the measurement table 110 can also deviate from the nominal position thereof in the z-direction, and so the vector $\Delta\vec{D}$ 550, unlike the previous vectors, represents a three-dimensional (3D) vector. An incorrect measurement table position 550 can be established by one or more of the interferometers 120 discussed in the context of FIG. 1. The data record for improving the reference image 570 can likewise contain the vector $\Delta\vec{D}$ 550.

Figure 6:
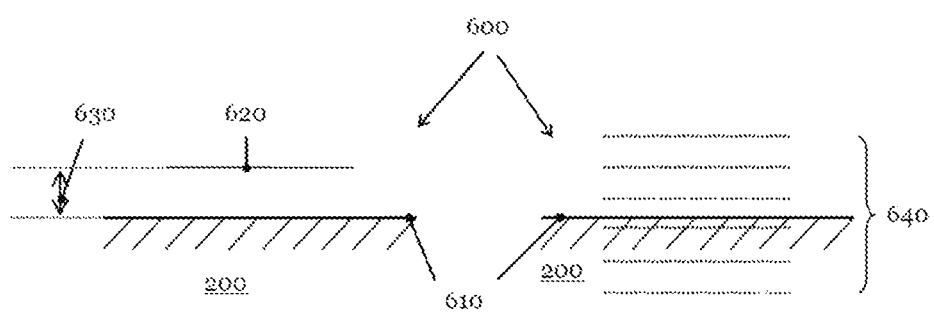
FIG. 6 schematically depicts an incorrect focus position of a reference image in the left-hand part and schematically specifies a possibility for determining the error of the focus position of the reference image in the right-hand part.

On the left-hand side, the diagram 600 in FIG. 6 shows the surface 610 of the photomask 105, 200. The position of the focus of the optical system 185 of the position determination apparatus 100 when recording the reference image 570 of the pattern element 470 is symbolized by the line 620. In the example depicted in FIG. 6, the focus did not correspond to the surface 610 of the mask 105, 200 but instead deviates therefrom by an unknown amount 630. The right-hand part of FIG. 6 represents the measurement of reference images of the pattern element 470 with different focus conditions, i.e. of a focus stack 640. The spacing in the z-direction of the focus of the various images of the focus stack 640 of the pattern element 470 is e.g. 20 nm. By measuring a series of reference images 570 with different focus conditions, it is possible to ensure that both under-focused (i.e. the focus lies above the surface) and over-focused (i.e. the focus lies below the surface 610) reference images are generated. By way of a contrast evaluation of the focus stack 640 of the reference image 570, the focus position $\Delta z_{Re.}$ 620 thereof can be determined. The focus position $\Delta z_{Re.}$ 620 of the reference image 570 can, as a parameter, likewise be included in the data record for optimizing the reference image 570.

The reference image 570 has noise, in particular pixel noise of the detector 135 of the position determination apparatus 100. The noise can be reduced by recording a plurality of reference images and by averaging the reference images 570. The measured reference image 570 is then replaced by an averaged reference image.

Alternatively, or additionally, a reference image 570 can be recorded with an exposure time which is longer than that of a measured image or a measurement image of the pattern element 470, to which the reference image is compared. Using this, the noise of the reference image 570 can likewise be reduced in an effective manner. In this case, the exposure time $t_{Re.}$ of the reference image 570 is included as a parameter in the data record for improving the reference image 570 in order to enable scaling of the reference image 570 to the exposure of a measurement image.

The aforementioned metadata in relation to the reference image 570 can be combined in a data record $\xi = \{\Delta\vec{E}_{Re.}(x,y), \Delta CD, \Delta\vec{D}, \Delta z_{Re.}, t_{Re.}\}$. If necessary, further metadata of the reference image 570 can be added to the data record $\xi$. By way of example, it is possible to provide design data as metadata for the data record $\xi$, which design data can then be used to optimize the reference image 570.

Figure 7:
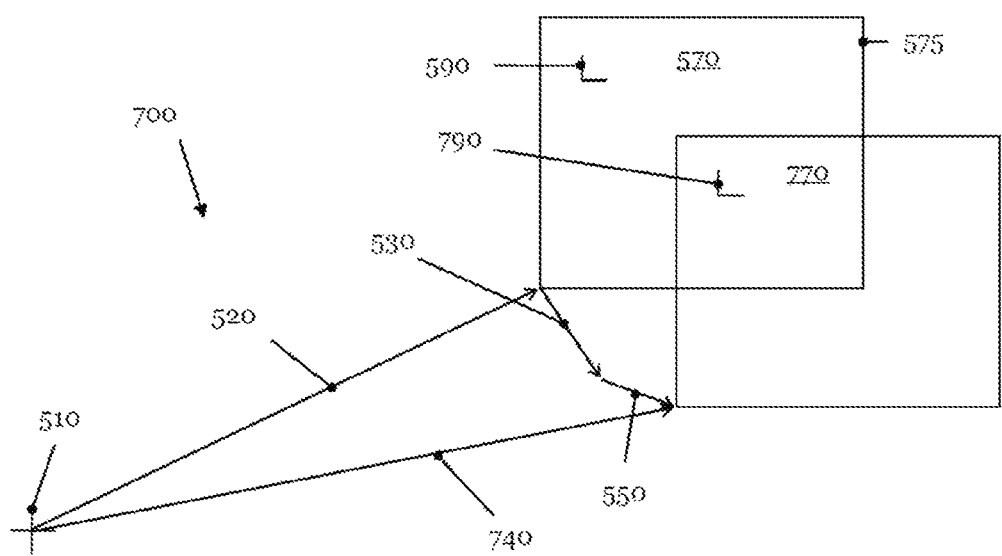
FIG. 7 schematically represents a displacement of a measured reference image in respect of a reference image which was analysed by an image evaluation method measuring in absolute terms and which elucidates a correction of an incorrect position of a measurement table while recording the reference image.

The optimization unit 165 of the computer system 145 of the position determination apparatus 100 generates an optimized reference image 770 on the basis of the measured reference image 570 and the metadata of the data record $\xi$. This is illustrated in FIG. 7. The optimization unit 165 displaces the pattern element 470 in relation to the measured reference image 570 by the vector $\Delta \vec{E}_{Re.}(x,y)$ 530. Thus, the positioning error or the write error of the reference image 570 in relation to an image evaluation method measuring in absolute terms is corrected. Furthermore, the optimization unit 165 displaces the pattern element 470 by the vector $\Delta \vec{D}(x,y)$ 550 in relation to the position $\vec{E}_{Re.Meas.}(x,y)$ 520 of the measured reference image 570. As a result, an incorrect position of the measurement table 110 during the recording of the reference image 570 is corrected. Furthermore, it is possible to eliminate an incorrect position of the measurement table 110 in the vertical direction or z-direction during the measurement of the reference image 570 (not depicted in FIG. 7). The vector $\vec{E}_{Re.Tar.}(x,y)$ 740 describes the position of the structure element 470 in the optimized reference image 770 in respect of the coordinate origin 510 or the reference point 510.

The critical dimension of the test structure 590 of the reference image 570 is changed by the optimization unit 165 on the basis of the parameter $\Delta$CD present in the data record $\xi$. Here, the CD value of the optimized reference image 770 can be increased or reduced in relation to the critical dimension of the reference image, depending on the result of the image evaluation method or methods, measuring in absolute terms, of the test structure 590.

Possibly present problems when recording the reference image 570 in respect of a non-ideal focus position are determined by evaluating a focus stack, as explained above in the discussion of FIG. 6. On the basis of the parameter $\Delta z_{Re}$, the optimization unit 165 corrects a sub-optimal focus position of the reference image 570.

The optimization unit 165 reduces noise in the reference image 570, in particular pixel noise, by averaging a plurality of reference images 570 and replacing the reference image 570 in the optimized reference image 770 by an averaged reference image. If the reference image 570 for reducing the pixel noise was recorded with a long exposure time $t_{Re}$, the optimization unit 165 scales the intensity distribution of the optimized reference image $I_{Re.Opt.}$ in the optimized reference image 770 in accordance with the equation:

$$I_{Re.Opt.} = I_{Re} \cdot \frac{t_{meas}}{t_{Re}}$$

Figure 8:
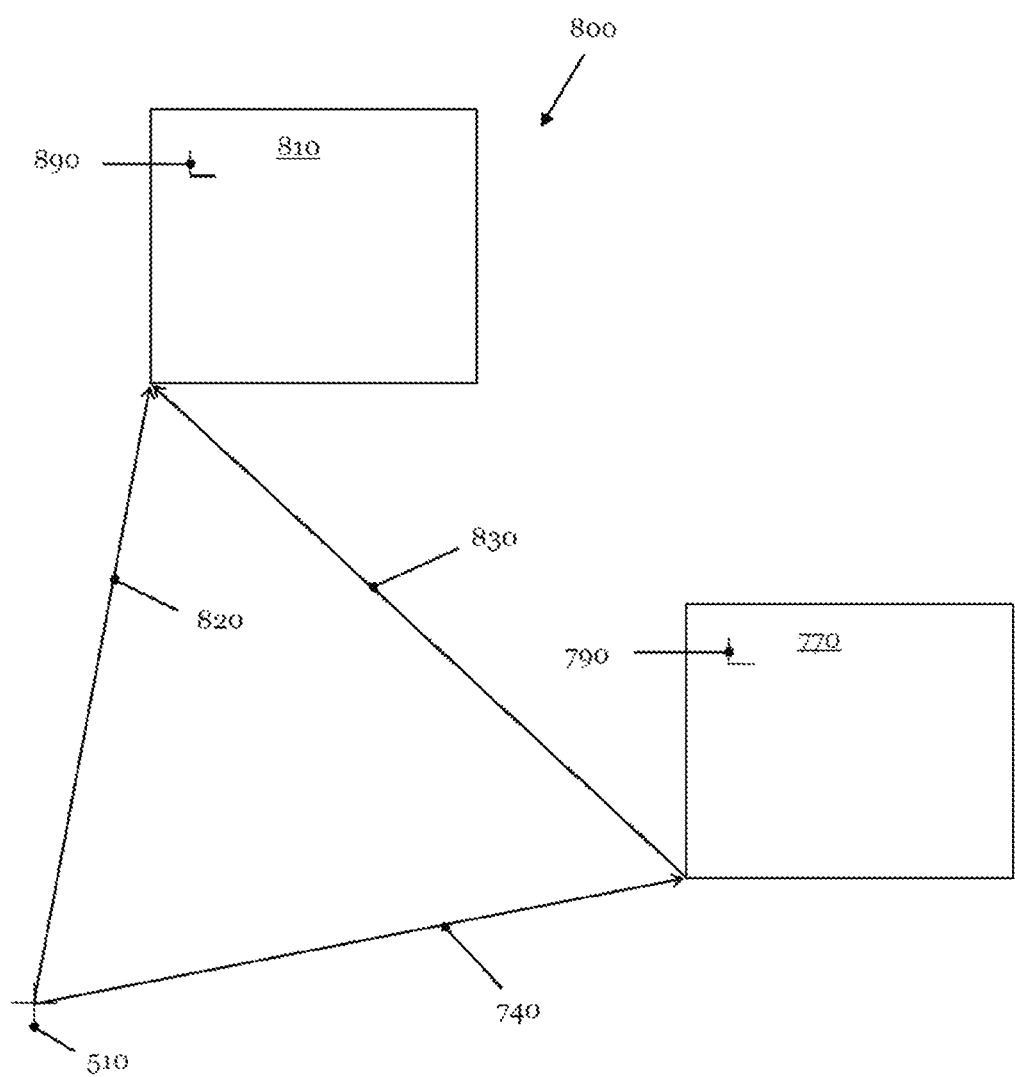
FIG. 8 schematically depicts the result of a correlation process of a measured image and an optimized reference image.

The optimized reference image 770 can now be used for correlation with measured images or measurement images. FIG. 8 shows the correlation result of a measurement image 810 with the optimized reference image 770. As already explained above in the context of FIG. 7, the vector $\vec{E}_{Re.Tar.}(x,y)$ 740 describes the position of the structure element 470 in the optimized reference image 770 in relation to the coordinate origin 510 of the laboratory coordinate system. The vector $\vec{E}_{Meas.}(x,y)$ 820 represents the position of the structure element 470 of the measured image 810 in respect of the coordinate origin 510. The vector $\vec{S}(x_{Meas.}-x_{Tar.},y_{Meas.}-y_{Tar.})$ describes the displacement of the structure element 470 of the measured image 810 in relation to the position of the structure element or pattern element 470 of the optimized reference image 770. The absolute positioning error or write error of the structure element 470 of the measurement image 810 can be established on the basis of the correlation result which supplies the displacement vector $\vec{S}(x_{Meas.}-x_{Tar.},y_{Meas.}-y_{Tar.})$ and the position of the structure element 470 of the optimized reference image 770 represented by the vector $\vec{E}_{Re.Tar.}(x,y)$:

$\vec{E}_{Meas.}(x,y)=\vec{E}_{Re.Tar.}(x,y)+\vec{S}(x_{Meas.}-x_{Tar.},y_{Meas.}-y_{Tar.})$. The vector $\vec{E}_{Re.Tar.}(x,y)$ provides the optimized reference image 770 and the displacement vector $\vec{S}(x_{Meas.}-x_{Tar.},y_{Meas.}-y_{Tar.})$ supplies the correlation of measured image 810 and optimized reference image 770.

By comparing the critical dimension of the test structure 890 of the measured image 810 with the CD of the test structure 790 of the optimized reference image 770, it is possible to establish the change in the CD of the measured image 810 in relation to the critical dimension of the optimized reference image. A decision as to whether or not the critical dimension of the measurement image 810 meets a predetermined specification can be made on the basis of the CD variation of the measured image 810. The pattern element 470 of the measurement image 810 is substantially characterized by establishing the two variables absolute positioning error and line width or critical dimension of a structure element 470 with the aid of the optimized reference image 770 and the displacement vector $\vec{S}(x_{Meas.}-x_{Tar.},y_{Meas.}-y_{Tar.})$.

Figure 9:
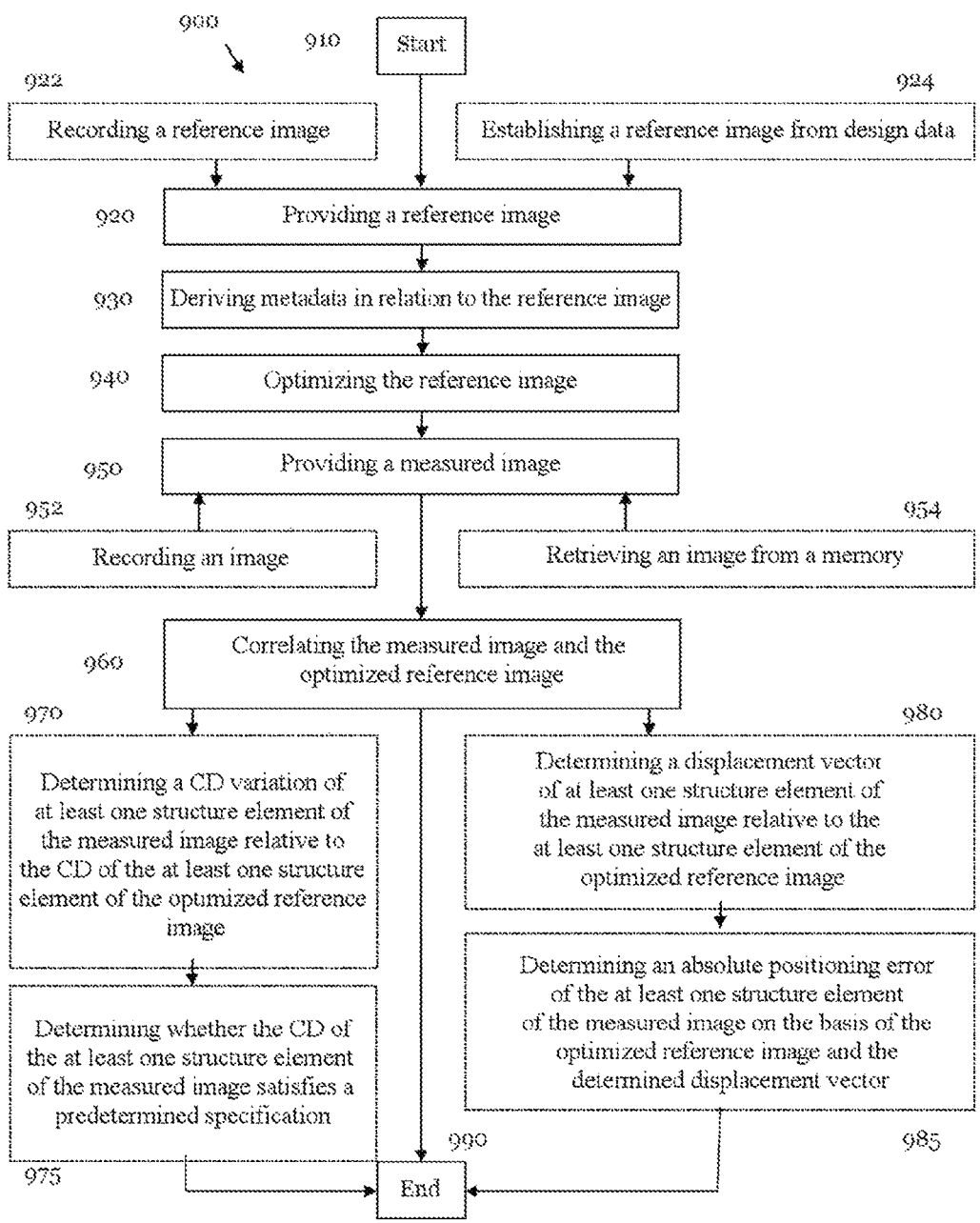
FIG. 9 reproduces a flowchart of an exemplary embodiment of the method for determining the position of a structure element of a photomask.

FIG. 9 shows a flowchart 900 of an exemplary embodiment of the method, defined in this application, for determining the position of a structure element 470 of a photolithographic mask 105, 200. The method steps which are optional for carrying out the method specified in this application are depicted with a dotted frame in FIG. 9. The method starts at step 910. A reference image 570 is provided in the next step 920. A reference image 570 can be provided to the method by recording a reference image 570 with a position determination apparatus 100 (step 922). Alternatively, a reference image 570 can be generated from the design data of a photomask 105, 200 (step 924).

Metadata in relation to the reference image 570 are derived in step 930. The metadata can be combined in a data record $\xi$. In step 940, the derived metadata are used to optimize the provided reference image 570, i.e. to generate an optimized reference image 770.

A measured image 810 or measurement image 810 is provided in step 950. The provision of a measured image 810 can be carried out by recording a measurement image 810 (step 952). Alternatively, an already available measurement image can be loaded from a memory, for example the memory 150 of the computer system 145 (step 954). In step 960, a correlation of the measured image 810 with the optimized reference image 770 is carried out. The method ends at step 990.

Optionally, the critical dimension of the structure element 470 of the measured image 810 relative to the CD of the structure element 470 of the optimized reference image 770 can furthermore be determined in step 970. Furthermore, it is possible to determine in step 975 whether the critical dimension of the measurement image 810 satisfies a predetermined specification. Then, the method ends at step 990.

Moreover, a 2D displacement vector $\vec{S}(x_{Meas.}-x_{Tar.},y_{Meas.}-y_{Tar.})$ of a structure element 470 of the measured image 810 can be determined, likewise optionally, relative to the structure element 470 of the optimized reference image 770 in step 980. In step 985, the absolute positioning error (i.e. in relation to the coordinate origin 510 of the laboratory coordinate system) of the structure element 470 of the measured image 810 can, likewise optionally, be established with the aid of the displacement vector $\vec{S}(x_{Meas.}-x_{Tar.},y_{Meas.},-y_{Tar.})$ and the position of the structure element 470 of the optimized reference image 770 $\vec{E}_{Re.Tar.}(x_{Tar.},y_{Tar.})$: $\vec{E}_{Meas.}(x_{Meas.},y_{Meas.})=\vec{E}_{Re.Tar.}(x_{Tar.},y_{Tar.})+\vec{S}(x_{Meas.}-x_{Tar.},y_{Meas.},-y_{Tar.})$. Then, the method likewise ends at step 990.

The two parallel optional steps 970 and 975, and 980 and 985 can each be carried out individually or together for a structure element 470 of a chip 410 of the mask 200.

Figure 10:
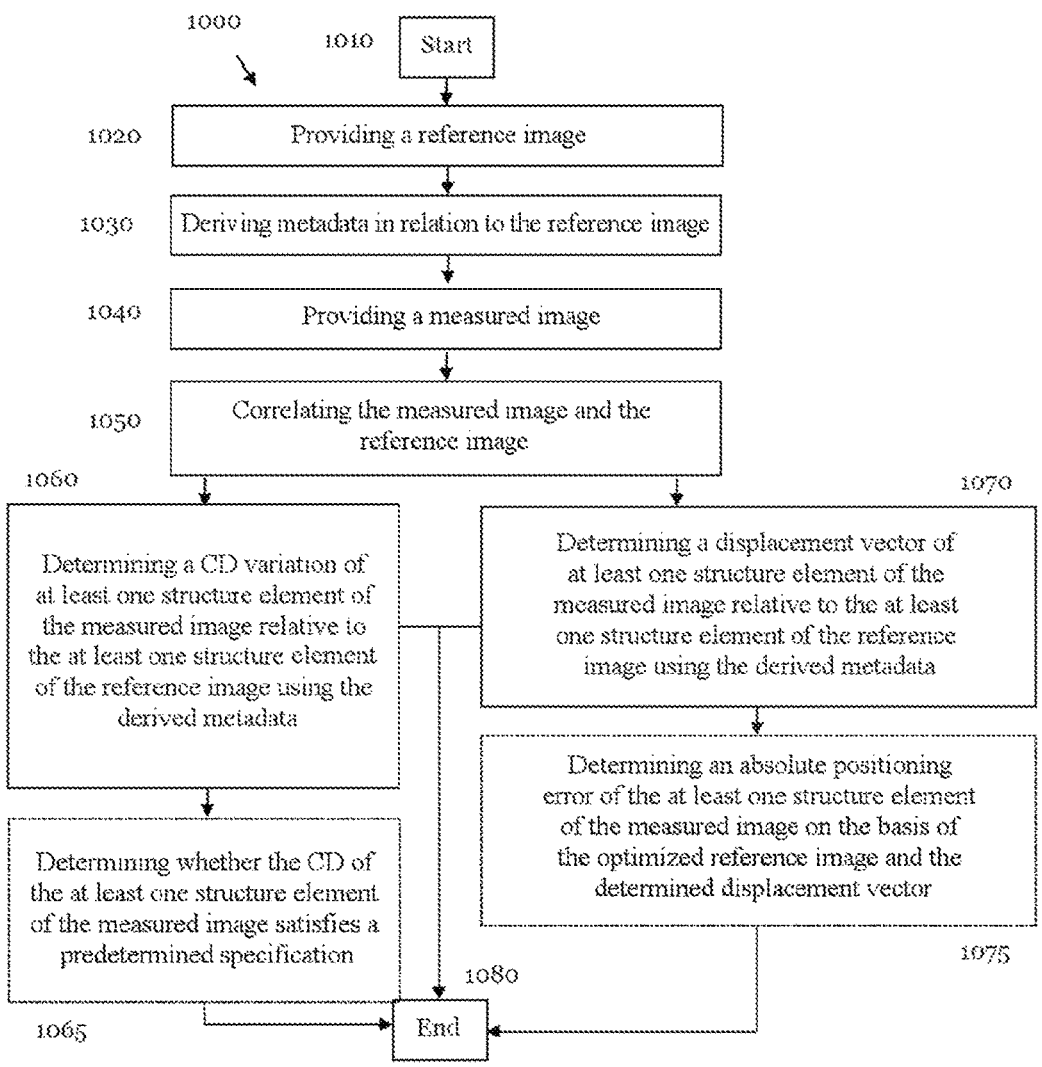
FIG. 10 represents a flowchart of a second exemplary embodiment of the method for determining the position of a structure element of a photomask.

FIG. 10 reproduces a flowchart 1000 of a second exemplary embodiment of the method, defined in this application, for determining a position of a structure element 470 of a photolithographic mask 105, 200. Some of the method steps, which are optional steps and were already discussed in the context of FIG. 9, are not specified in the flowchart 1000. The method starts at step 1010. A reference image 570 of the structure element 470 is provided in the next step 1020.

Metadata in relation to the reference image 570 are derived in step 1030. A measured image 810 or measurement image 810 of the structure element 470 is provided in step 1040. In the next step 1050, the image data of the structure element 470 of the measured image 810 and of the reference image 570 are correlated.

Thereupon, a CD variation of the structure element 470 of the measured image 810 relative to the structure element 470 of the reference image 570 is established in step 1060, with the derived metadata of the data record ξ being used here. Then, the method ends at step 1080. It is optionally possible to determine by carrying out the step 1065 whether or not the critical dimension of the structure element 470 of the measured image 810 meets a predetermined specification. Thereupon, the method likewise ends at step 1080.

Step 1070 can be carried out as an alternative, or in addition, to step 1060; here a displacement vector of the structure element 470 of the measured image 810 relative to the structure element 470 of the reference image 570 is established. The metadata derived for the reference image 570, which are assembled in the data record ξ, are taken into account when determining the displacement vector. Then, the method ends at step 1080. It is optionally possible in step 1075 to determine the absolute positioning error of the structure element 470 of the measured image 810 in relation to the reference image 570. Here, the metadata of the data record ξ, in particular the vector $\Delta\vec{D}$, are used in addition to the position of the structure element 470 in the reference image 570 and the previously established displacement vector. After carrying out this option, the method once again ends at step 1080.

In addition to determining positioning errors and the critical dimension, the calculation of overlay errors between different structures or pattern elements of various masks of a mask stack is a typical application for the method described in this application. Therefore, the effect of the explained method for this application is explained below in an exemplary manner.

Figure 11:
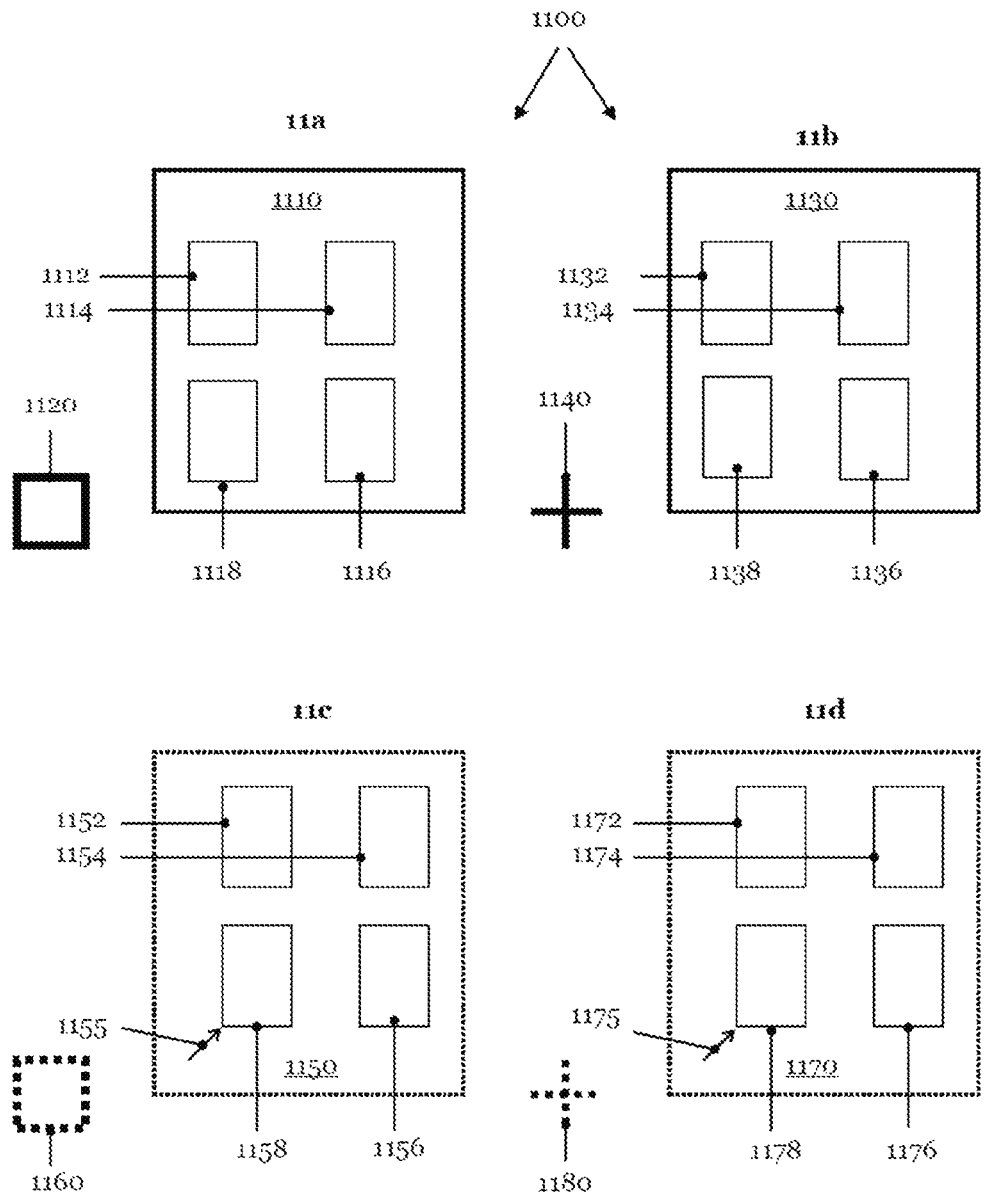
FIG. 11 shows a portion of a first mask in sub

The diagram 1100 in FIG. 11 shows, in sub-FIG. 11a, a portion 1110 of a first mask in a mask stack with an associated alignment marking 1120 in the form of a frame. The portion 1110 of the first mask comprises four structure elements 1112, 1114, 1116 and 1118, which are symbolized by rectangles in FIG. 11. The sub-FIG. 11b of FIG. 11 represents a portion 1130 of a second photomask in a mask stack. The portion 1130 of the second mask likewise contains four pattern elements 1132, 1134, 1136 and 1138, which are likewise depicted as rectangles in sub-FIG. 11b. The marking 1140 of the second portion 1130 has the form of a cross 1140.

The sub-FIG. 11c of FIG. 11 reproduces a reference image 1150 of the portion 1110 of the first mask. The structure elements 1152, 1154, 1156 and 1158 of the reference image 1150 have a systematic positioning error $\vec{E}_{Re.,M1}(x,y)$, which is depicted by the arrow 1155. Furthermore, the reference image 1170 of the second portion 1130, which is specified in sub-FIG. 11d, likewise has a positioning error $\vec{E}_{Re.,M2}(x,y)$, which is denoted by the arrow 1175 in sub-FIG. 11d. For reasons of simplicity, the positioning errors $\vec{E}_{Re.,M1}(x,y)$ and $\vec{E}_{Re.,M2}(x,y)$ of the two reference images 1150 and 1170 have a similar positioning error. A person skilled in the art will acknowledge that the application of the method described in this application is not restricted to the example specified in FIG. 11. Instead, it can be used to correct any positioning errors $\vec{E}_{Re.,M1}(x,y)$ and $\vec{E}_{Re.,M2}(x,y)$ of reference images, which belong to different masks of a mask stack.

Figure 12:
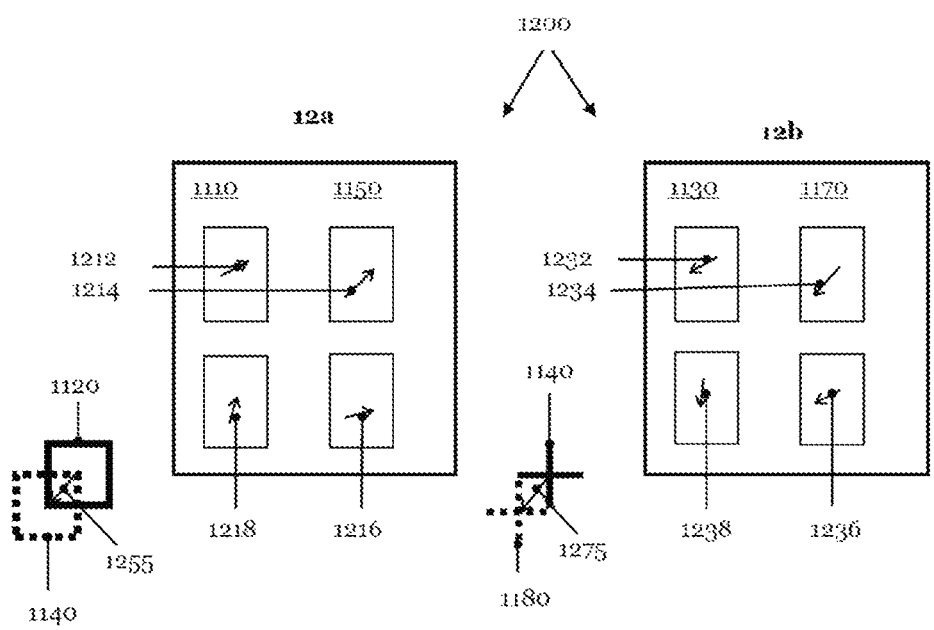
FIG. 12 elucidates the correlation of the portion of the first mask with the corresponding reference image in sub-FIG. 12*a* and the correlation of the portion of the second mask with the corresponding reference image in sub-FIG. 12*b*.

In sub-FIG. 12a, the diagram 1200 in FIG. 12 shows the result of a correlation process of the portion 1110 of the first mask with the associated reference image 1150. The correlation provides the positioning errors $\vec{R}_{M1,1}$, $\vec{R}_{M1,2}$, $\vec{R}_{M1,3}$ and $\vec{R}_{M1,4}$ of the structure elements 1112, 1114, 1116 and 1118 of the portion 1110 of the first mask, which are depicted by the arrows 1212, 1214, 1216 and 1218. The positioning error $\vec{E}_{Re.,M1}(x,y)$ of the reference image 1150 appears in the left-hand sub-FIG. 12a as a displacement 1255 of the alignment marking 1140 of the reference image 1150 in relation to the marking 1120 of the portion 1110 of the first mask.

The right-hand sub-FIG. 12b represents the result of the correlation process of the reference image 1170 with the portion 1130 of the second photomask. The positioning errors $\vec{R}_{M2,1}$, $\vec{R}_{M2,2}$, $\vec{R}_{M2,3}$ and $\vec{R}_{M2,4}$ of the pattern elements 1132, 1134, 1136, 1138 of the portion 1130 of the second mask of the mask stack are represented by the arrows 1232, 1234, 1236 and 1238. The arrow 1275 denotes the displacement of the alignment marking 1180 of the reference image 1170 in relation to the marking 1140 of the portion 1130 of the second photomask due to the positioning error $\vec{E}_{Re.,M2}(x,y)$ of the structure elements 1172, 1174, 1176 and 1178 of the reference mask 1170.

Figure 13:
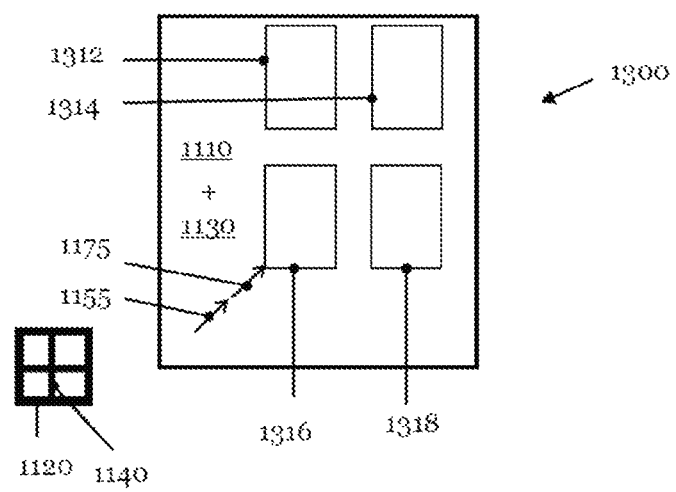
FIG. 13 schematically represents the overlay of the portions of the first mask and of the second mask without correcting the positioning errors of the associated reference images of the portions of the first mask and of the second mask.

The diagram 1300 in FIG. 13 represents the result of the overlay process of the portion 1110 of the first mask and of the portion 1130 of the second mask. The error of the overlay or of the alignment of the two mask portions 1110 and 1130 is described in the example depicted in FIG. 13 by the equation:

$$\Delta\vec{E}_{Overlay,1,2} = \sum_{i=1}^{2}\sum_{j=1}^{4}(\vec{E}_{Re,i,j}+\vec{R}_{Mi,j}).$$

As depicted in FIG. 13, the positioning errors $\vec{R}_{M1,1}$ 1212, $\vec{R}_{M1,2}$ 1214, $\vec{R}_{M1,3}$ 1216, $\vec{R}_{M1,4}$ 1218, $\vec{R}_{M2,1}$ 1232, $\vec{R}_{M2,2}$ 1234, $\vec{R}_{M2,3}$ 1236 and $\vec{R}_{M2,4}$ 1238 of the structure elements 1112, 1114, 1116, 1118, 1132, 1134, 1136 and 1138 can be largely compensated by the overlay process. On the other hand, the positioning errors $\vec{E}_{Re.,M1}(x,y)$ 1155 and $\vec{E}_{Re.,M2}(x,y)$ 1175 of the reference images 1150 and 1170 add in the example of FIG. 13.

By contrast, if the positioning errors $\vec{E}_{Re.,M1}(x,y)$ 1155 and $\vec{E}_{Re.,M2}(x,y)$ 1175 of the reference images 1150 and 1170 are measured and corrected as explained above by virtue of optimized reference images being generated, the following approximately emerges for the positioning error of the reference images:

$$\Delta \vec{E}_{Overlay,Re,1,2} = \sum_{i=1}^{2} \sum_{j=1}^{4} \vec{E}_{Mi,j} \approx 0.$$

The overlay error of the two mask portions 1110 and 1130 is therefore substantially determined by the positioning errors $\vec{R}_{M2,2}$ of the individual structure elements 1112, 1114, 1116, 1118, 1132, 1134, 1136 and 1138 of the two mask portions:

$$\Delta \vec{E}_{Overlay,1,2} = \sum_{i=1}^{2} \sum_{j=1}^{4} \vec{R}_{Mi,j}.$$

Figure 14:
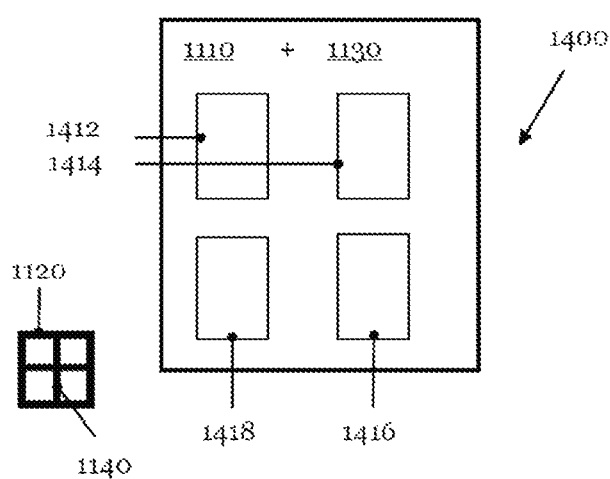
FIG. 14 schematically reproduces the overlay of the portions of the first mask and of the second mask after correcting the positioning errors of the associated reference images of the portions of the first mask and of the second mask.

This situation is illustrated in FIG. 14. The generation of optimized reference images (which are not depicted in FIG. 14) corresponds to a centration of the reference images to the ideal position thereof. As a result, the overlay error becomes independent of the positioning errors of the reference images 1150 and 1170 of the portions 1110, 1130 of the two masks.

In an alternative embodiment, the positioning errors $\vec{E}_{Re.,M1}(x,y)$ 1155 and $\vec{E}_{Re.,M2}(x,y)$ 1175 can be transferred as metadata to the correlation unit 165 of the position determination apparatus 100 and they can be taken into account during the overlay process of the portions 1110 and 1130 of the first and second photomask. This embodiment avoids the generation of optimized reference images.

In some implementations, the computer system 145 can include one or more processors and one or more computer-readable media (e.g., RAM, ROM, SDRAM, hard disk, optical disk, and flash memory). The one or more processors can perform various calculations described above. The calculations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media include, without limitation, coaxial cables, copper wire, fiber optics and free space. The memory 150 can include any type of memory, such as RAM, ROM, SDRAM, and flash memory.

The features described above can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and optical discs such as CD-ROM, DVD-ROM, and Blu-ray BD-ROM discs. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A method for determining a position of at least one structure element of a photolithographic mask, the method comprising the following steps:
   a. providing a reference image of the at least one structure element of the photolithographic mask, in which the photolithographic mask is configured to be used in a lithography process wherein an exposure apparatus illuminates the photolithographic mask and light passing through the mask or reflected by the mask is projected, by using a projection optics system, onto a substrate that is coated with a light-sensitive layer in order to transfer one or more structure elements of the mask onto the light-sensitive coating of the substrate;

b. deriving a data record for the reference image of the at least one structure element of the photolithographic mask, said data record comprising metadata relating to the reference image of the at least one structure element of the photolithographic mask;

c. providing at least one measured image of the at least one structure element of the photolithographic mask, wherein providing the at least one measured image of the at least one structure element of the photolithographic mask comprises using at least one alignment marking of the photolithographic mask to align a measurement table onto the photolithographic mask; and d. optimizing the reference image of the at least one structure element of the photolithographic mask by use of the derived data record and correlating the at least one measured image of the photolithographic mask and the optimized reference image;

wherein the metadata relate to at least one defect of the reference image of the at least one structure element of the photolithographic mask, wherein the at least one defect comprises noise in the reference image of the at least one structure element of the photolithographic mask, and wherein optimizing the reference image of the at least one structure element of the photolithographic mask comprises the following: reducing the noise in the reference image of the photolithographic mask by replacing the reference image of the photolithographic mask with an averaged reference image of the photolithographic mask of at least two measured reference images of the photolithographic mask.

2. The method according to claim 1, wherein the metadata further relate to at least one of the following aspects:
   at least one additional defect of the reference image of the at least one structure element of the photolithographic mask; or
   at least one incorrect setting of the measurement table, which holds a reference mask while recording the reference image of the at least one structure element of the photolithographic mask.

3. The method according to claim 2, wherein the at least one additional defect of the reference image of the at least one structure element of the photolithographic mask comprises at least one of the following causes: a positioning error of the at least one structure element of the reference image of the photolithographic mask, or a critical dimension of the at least one structure element of the photolithographic mask which lies outside of a predetermined range of the photolithographic mask, or noise in the reference image of the at least one structure element of the photolithographic mask.

4. The method according to claim 3, wherein deriving the data record comprises at least one of the following:
   determining the at least one positioning error of the at least one structure element of the reference image of the photolithographic mask by use of at least one of a threshold-based image evaluation method, a centroid-based image evaluation method, or a symmetry-correlation image evaluation method; or
   determining the critical dimensions of the at least one structure element of the photolithographic mask by use of at least one of the threshold-based image evaluation method, the centroid-based image evaluation method, or the symmetry-correlation image evaluation method.

5. The method according to claim 3, wherein deriving the data record comprises the following: recording the reference image of the at least one structure element of the photolithographic mask at least twice and averaging the at least two reference images of the at least one structure element of the photolithographic mask.

6. The method according to claim 3, wherein deriving the data record comprises the following: recording at least two reference images of the at least one structure element of the photolithographic mask with different exposure times and scaling the at least two reference images to the exposure time of the at least one measured image of the photolithographic mask.

7. The method according to claim 1, wherein the metadata further relate to at least one incorrect setting of the measurement table, which holds the photolithographic mask while recording the reference image of the at least one structure element of the photolithographic mask,
   wherein deriving the data record comprises at least one of the following: (i) determining a position of the measurement table in the plane of the photolithographic mask while recording the reference image of the at least one structure element of the photolithographic mask with the aid of at least one interferometer or (ii) determining a position of the measurement table perpendicular to the plane of the photolithographic mask while recording the reference image of the at least one structure element of the photolithographic mask with the aid of an interferometer.

8. The method according to claim 1, wherein the metadata further relate to at least one parameter setting of an optical system of a position determination apparatus, and the at least one parameter setting comprises a position of a focus when recording the reference image,
   wherein deriving the data record comprises at least one of the following: determining the position of the focus when recording the reference image of the at least one structure element of the photolithographic mask by evaluating a focus stack of the reference image or determining the position of the focus when recording the reference image of the at least one structure element of the photolithographic mask by recording a focus stack of the reference image and evaluating the focus stack of the reference image.

9. The method according to claim 3, wherein optimizing the reference image of the at least one structure element of the photolithographic mask further comprises at least one of the following: correcting the at least one positioning error of the at least one structure element of the reference image of the photolithographic mask or correcting the critical dimension of the at least one structure element of the reference image of the photolithographic mask such that this satisfies a predetermined specification.

10. The method according to claim 1, furthermore comprising the following step: determining a displacement vector, which describes a magnitude and a direction of a displacement of the at least one structure element of the optimized reference image of the at least one structure element of the photolithographic mask and of the at least one structure element of the at least one measured image of the photolithographic mask, after carrying out step d.

11. The method according to claim 10, furthermore comprising the following step: determining an absolute positioning error of the at least one structure element of the photolithographic mask of the at least one measured image of the photolithographic mask from an absolute position of the at least one structure element of the optimized reference image of the photolithographic mask and the determined displacement vector of the at least one structure element of the photolithographic mask.

12. The method according to claim 2, wherein the at least one additional defect of the reference image of the at least one structure element of the photolithographic mask comprises a critical dimension of the at least one structure element of the photolithographic mask which lies outside of a predetermined range of the photolithographic mask, and the method further comprises the following step: determining whether the critical dimension of the at least one structure element of the measured image of the photolithographic mask satisfies a predetermined specification.

13. The method according to claim 1, wherein providing the reference image of the at least one structure element of the photolithographic mask comprises the following: recording the at least one structure element of a reference mask by use of a position determination apparatus and/or establishing the reference image of the at least one structure element of the photolithographic mask from design data of the at least one structure element of the photolithographic mask.

14. The method according to claim 1, wherein the provision of the at least one measured image of the photolithographic mask comprises recording of the at least one measured image of the photolithographic mask by use of a position determination apparatus.

15. An apparatus for determining a position of at least one structure element of a photolithographic mask, the apparatus comprising:
    a. means for providing a reference image of the at least one structure element of the photolithographic mask, in which the photolithographic mask is configured to be used in a lithography process wherein an exposure apparatus illuminates the photolithographic mask and light passing through the mask or reflected by the mask is projected onto a substrate that is coated with a light-sensitive layer in order to transfer one or more structure elements of the mask onto the light-sensitive coating of the substrate;
    b. means for deriving a data record for the reference image of the at least one structure element of the photolithographic mask, said data record comprising metadata relating to the reference image of the at least one structure element of the photolithographic mask;
    c. means for providing at least one measured image of the at least one structure element of the photolithographic mask, wherein the means for providing the at least one measured image of the at least one structure element of the photolithographic mask comprises means for using at least one alignment marking of the photolithographic mask to align a measurement table onto the photolithographic mask; and
    d. means for optimizing the reference image of the at least one structure element of the photolithographic mask and means for correlating the at least one measured image of the at least one structure element of the photolithographic mask and the optimized reference image of the at least one structure element of the photolithographic mask;
    wherein the metadata relate to at least one defect of the reference image of the at least one structure element of the photolithographic mask,
    wherein the at least one defect comprises noise in the reference image of the at least one structure element of the photolithographic mask, and
    wherein optimizing the reference image of the at least one structure element of the photolithographic mask comprises the following: reducing the noise in the reference image of the photolithographic mask by replacing the reference image of the photolithographic mask with an averaged reference image of the photolithographic mask of at least two measured reference images of the photolithographic mask.

16. An apparatus for determining a position of at least one structure element of a photolithographic mask, the apparatus comprising:
    a storage storing a computer program comprising instructions; and
    a computer system configured to execute the instructions to carry out the method steps of claim 1.

17. A non-transitory computer readable medium storing a computer program containing instructions which prompt a computer system to execute the method steps in claim 1.

18. A position determination apparatus for determining a position of at least one structure element of a photolithographic mask, the position determination apparatus comprising:
    a. a measurement table which is movable in at least two spatial directions and which is embodied to hold the photolithographic mask, in which the photolithographic mask is configured to be used in a lithography process wherein an exposure apparatus illuminates the photolithographic mask and light passing through the mask or reflected by the mask is projected onto a substrate that is coated with a light-sensitive layer in order to transfer one or more structure elements of the mask onto the light-sensitive coating of the substrate;
    b. an optical system comprising an exposure system and a detector which is embodied to record the reference image of the at least one structure element of the photolithographic mask and to record at least one measured image of the at least one structure element of the photolithographic mask, wherein the optical system is further adapted to use at least one alignment marking of the photolithographic mask to align the measurement table onto the photolithographic mask;
    c. an analysis unit which is embodied to analyze the reference image of the at least one structure element of the photolithographic mask for deriving at least one data record which relates to the reference image of the at least one structure element of the photolithographic mask said data record comprising metadata relating to the reference image of the at least one structure element of the photolithographic mask;
    d. an optimization unit which is embodied to optimize the reference image of the at least one structure element of the photolithographic mask with the aid of the derived data record; and
    e. a correlation unit which is embodied to carry out a correlation of the optimized reference image of the at least one structure element of the photolithographic mask and the at least one measured image of the at least one structure element of the photolithographic mask,
    wherein the metadata relate to at least one defect of the reference image of the at least one structure element of the photolithographic mask,
    wherein the at least one defect comprises noise in the reference image of the at least one structure element of the photolithographic mask, and
    wherein optimizing the reference image of the at least one structure element of the photolithographic mask comprises the following: reducing the noise in the reference image of the photolithographic mask by replacing the reference image of the photolithographic mask with an averaged reference image of the photolithographic mask of at least two measured reference images of the photolithographic mask.

19. The method of claim 1, wherein the metadata further relate to at least one incorrect setting of the measurement table, which holds the photolithographic mask while recording the reference image of the at least one structure element of the photolithographic mask, in which the at least one incorrect setting of the measurement table comprises at least one of a change in position of the measurement table in the plane of the photolithographic mask in relation to a reference point while recording the reference image or a change in position of the measurement table in the plane perpendicular to the photolithographic mask.

20. The method of claim 1 in which the metadata further relate to at least one parameter setting of an optical system of the position determination apparatus, and the at least one parameter setting comprises at least one of a position of a focus when recording the reference image or an exposure time when recording the reference image.

21. The method according to claim 19, wherein optimizing the reference image of the at least one structure element of the photolithographic mask further comprises at least one of the following: correcting the position of the measurement table in the plane of the photolithographic mask while recording the reference image of the at least one structure element of the photolithographic mask with respect to a reference point or correcting the position of the measurement table in the direction perpendicular to the plane of the photolithographic mask with respect to a reference point.

22. The method according to claim 20, wherein optimizing the reference image of the at least one structure element of the photolithographic mask further comprises at least one of the following: correcting the reference image of the at least one structure element of the photolithographic mask with respect to the exposure time or correcting the focus of the reference image of the at least one structure element of the photolithographic mask.

23. A method for determining a position of at least one structure element of a photolithographic mask, the method comprising the following steps:
   a. providing a reference image of the at least one structure element of the photolithographic mask, in which the photolithographic mask is configured to be used in a lithography process wherein an exposure apparatus illuminates the photolithographic mask and light passing through the mask or reflected by the mask is projected, by using a projection optics system, onto a substrate that is coated with a light-sensitive layer in order to transfer one or more structure elements of the mask onto the light-sensitive coating of the substrate;
   b. deriving a data record for the reference image of the at least one structure element of the photolithographic mask, said data record comprising metadata relating to the reference image of the at least one structure element of the photolithographic mask;
   c. providing at least one measured image of the at least one structure element of the photolithographic mask, wherein providing the at least one measured image of the at least one structure element of the photolithographic mask comprises using at least one alignment marking of the photolithographic mask to align a measurement table onto the photolithographic mask; and
   d. optimizing the reference image of the at least one structure element of the photolithographic mask by use of the derived data record and correlating the at least one measured image of the photolithographic mask and the optimized reference image;
   wherein the metadata relate to at least one incorrect setting of the measurement table, which holds the photolithographic mask while recording the reference image of the at least one structure element of the photolithographic mask, in which the at least one incorrect setting of the measurement table comprises at least one of a change in position of the measurement table in the plane of the photolithographic mask in relation to a reference point while recording the reference image or a change in position of the measurement table in the plane perpendicular to the photolithographic mask.

24. A method for determining a position of at least one structure element of a photolithographic mask, the method comprising the following steps:
   a. providing a reference image of the at least one structure element of the photolithographic mask, in which the photolithographic mask is configured to be used in a lithography process wherein an exposure apparatus illuminates the photolithographic mask and light passing through the mask or reflected by the mask is projected, by using a projection optics system, onto a substrate that is coated with a light-sensitive layer in order to transfer one or more structure elements of the mask onto the light-sensitive coating of the substrate;
   b. deriving a data record for the reference image of the at least one structure element of the photolithographic mask, said data record comprising metadata relating to the reference image of the at least one structure element of the photolithographic mask;
   c. providing at least one measured image of the at least one structure element of the photolithographic mask, wherein providing the at least one measured image of the at least one structure element of the photolithographic mask comprises using at least one alignment marking of the photolithographic mask to align a measurement table onto the photolithographic mask; and
   d. optimizing the reference image of the at least one structure element of the photolithographic mask by use of the derived data record and correlating the at least one measured image of the photolithographic mask and the optimized reference image;
   wherein the metadata relate to at least one parameter setting of an optical system of the position determination apparatus, and the at least one parameter setting comprises at least one of a position of a focus when recording the reference image or an exposure time when recording the reference image.

* * * * *

UNITED STATES PATENT AND TRADEMARK OFFICE
CERTIFICATE OF CORRECTION

PATENT NO. : 10,380,733 B2
APPLICATION NO. : 15/205336
DATED : August 13, 2019
INVENTOR(S) : Dirk Seidel and Steffen Steinert Page 1 of 1

It is certified that error appears in the above-identified patent and that said Letters Patent is hereby corrected as shown below:

In the Claims

Column 19
Lines 50-52, in Claim 3, delete "photolithographic mask, or noise in the reference image of the at least one structure element of the photolithographic mask." and insert -- photolithographic mask. --

Column 22
Line 45, in Claim 18, delete "mask said data record" and insert -- mask, said data record --

Signed and Sealed this
Eighth Day of October, 2019

Andrei Iancu
*Director of the United States Patent and Trademark Office*